US008261119B2

(12) United States Patent
Iwamoto (10) Patent No.: US 8,261,119 B2
(45) Date of Patent: Sep. 4, 2012

(54) TEST APPARATUS FOR TESTING DEVICE HAS SYNCHRONIZATION MODULE WHICH SYNCHRONIZES ANALOG TEST MODULE TO DIGITAL TEST MODULE BASED ON SYNCHRONIZATION SIGNAL RECEIVED FROM DIGITAL TEST MODULE

(75) Inventor: Satoshi Iwamoto, Saitama (JP)

(73) Assignee: Advantest Corporation, Tokyo (JP)

( * ) Notice: Subject to any disclaimer, the term of this patent is extended or adjusted under 35 U.S.C. 154(b) by 404 days.

(21) Appl. No.: 12/557,474

(22) Filed: Sep. 10, 2009

(65) Prior Publication Data
US 2011/0060933 A1 Mar. 10, 2011

(51) Int. Cl.
*G06F 1/12* (2006.01)
(52) U.S. Cl. ........................................ 713/400
(58) Field of Classification Search .................. 713/400, 713/401
See application file for complete search history.

(56) References Cited

U.S. PATENT DOCUMENTS

| 4,707,834 | A  | * | 11/1987 | Frisch et al. ........................ 714/31 |
| 6,028,439 | A  |   | 2/2000  | Arkin et al. |
| 6,864,699 | B2 | * | 3/2005  | Sakayori et al. ......... 324/762.02 |
| 7,672,805 | B2 | * | 3/2010  | Kushnick et al. .............. 702/125 |
| 2004/0239310 | A1 |   | 12/2004 | Oshima et al. |
| 2005/0114550 | A1 |   | 5/2005  | Kushnick |
| 2008/0077350 | A1 | * | 3/2008  | Reichert ........................ 702/125 |
| 2009/0024889 | A1 | * | 1/2009  | Forrest et al. .................. 714/733 |

FOREIGN PATENT DOCUMENTS

| JP | H5-107307 A | 4/1993 |
| JP | H5-203702 A | 8/1993 |
| JP | 2001-522049 A | 11/2001 |
| JP | 2007-052028 A | 3/2007 |
| JP | 2007-512502 A | 5/2007 |
| WO | 03/062843 A1 | 7/2003 |
| WO | 2004/072670 A1 | 8/2004 |

OTHER PUBLICATIONS

Evans, "The New ATE: Protocol Aware", Test Conference, IEEE International, Oct. 2007, pp. 1-10, Santa Clara, CA.
Japanese Office Action dated on Jan. 4, 2011, in a counterpart Japanese patent application of Application No. JP2010-196909.
Japanese Office Action dated on Oct. 5, 2010, in a counterpart Japanese patent application of Application No. JP2010-196909.

* cited by examiner

*Primary Examiner* — Chun Cao
(74) *Attorney, Agent, or Firm* — Chen Yoshimura LLP (57) ABSTRACT

There is provided a test apparatus for testing a device under test, including a plurality of test modules that test the device under test, and a synchronization module that is connected to each of the plurality of test modules, where the synchronization module synchronizes together the plurality of test modules. Here, based on a synchronization signal received from a digital module, the synchronization module synchronizes an analog module to the digital module, and the digital module is one of the plurality of test modules that exchanges a digital signal with the device under test, and the analog module is one of the plurality of test modules that performs an analog test on the device under test.

20 Claims, 7 Drawing Sheets

TEST APPARATUS FOR TESTING DEVICE HAS SYNCHRONIZATION MODULE WHICH SYNCHRONIZES ANALOG TEST MODULE TO DIGITAL TEST MODULE BASED ON SYNCHRONIZATION SIGNAL RECEIVED FROM DIGITAL TEST MODULE

BACKGROUND

1. Technical Field

The present invention relates to a test apparatus and a test method.

2. Related Art

A known test apparatus designed for testing a device under test such as a semiconductor chip includes a plurality of test circuits that operate in synchronization with each other (for example, see Patent Documents 1 and 2).

Patent Document 1: International Publication No. 2003/062843 Pamphlet

Patent Document 2: Japanese Patent Application Publication No. 2007-052028

A plurality of test circuits in a test apparatus operate in accordance with programs, sequences and the like provided thereto in advance. The test apparatus synchronously starts and suspends the execution of the programs, sequences and the like, so that the respective test circuits operate in synchronization with each other.

When the test apparatus is configured to perform a variety of tests, however, synchronizing the execution start timings of the programs at the respective test circuits may not be sufficient to synchronously perform the various tests. For example, there may be a case where the test circuits may desire to perform a particular step in synchronization with each other on condition that a predetermined test circuit detects a failure while the test circuits are executing programs. Furthermore, when the test apparatus is designed to perform a variety of tests including a test utilizing an analog circuit, the test circuits that are required to operate in synchronization with each other include an analog circuit.

SUMMARY

Therefore, it is an object of an aspect of the innovations herein to provide a test apparatus and a test method which are capable of overcoming the above drawbacks accompanying the related art. The above and other objects can be achieved by combinations described in the independent claims. The dependent claims define further advantageous and exemplary combinations of the innovations herein.

According to a first aspect related to the innovations herein, one exemplary apparatus may include a test apparatus for testing a device under test, including a plurality of test modules that test the device under test, and a synchronization module that is connected to each of the plurality of test modules, where the synchronization module synchronizes together the plurality of test modules. Here, based on a synchronization signal received from a digital module, the synchronization module synchronizes to the digital module an analog module, and the digital module is one of the plurality of test modules that exchanges a digital signal with the device under test, and the analog module is one of the plurality of test modules that performs an analog test on the device under test.

The summary clause does not necessarily describe all necessary features of the embodiments of the present invention. The present invention may also be a sub-combination of the features described above. The above and other features and advantages of the present invention will become more apparent from the following description of the embodiments taken in conjunction with the accompanying drawings.

DESCRIPTION OF EXEMPLARY EMBODIMENTS

Some aspects of the invention will now be described based on the embodiments, which do not intend to limit the scope of the present invention, but exemplify the invention. All of the features and the combinations thereof described in the embodiment are not necessarily essential to the invention.

Figure 1:
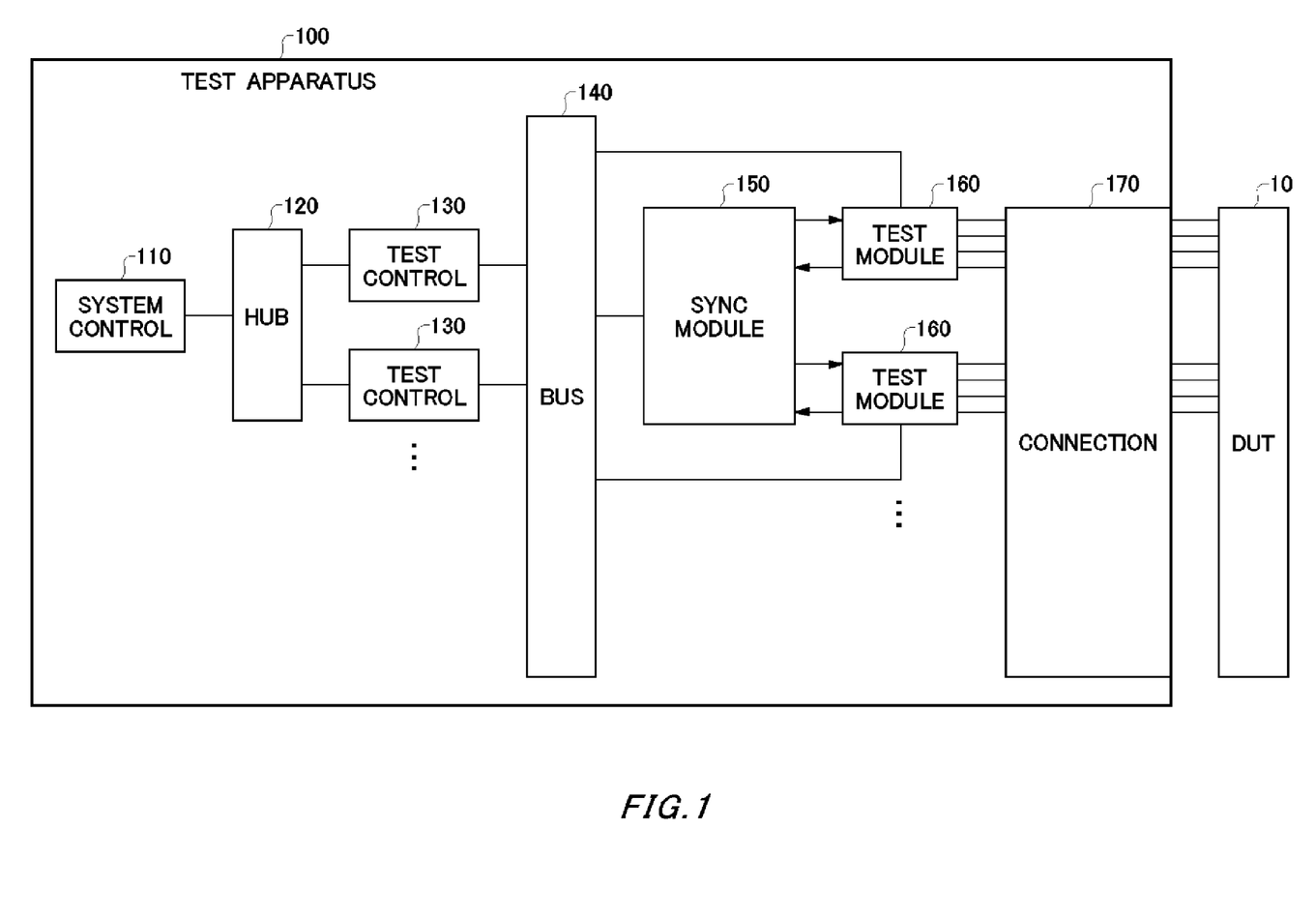
FIG. 1 illustrates an exemplary configuration of a test apparatus 100 relating to an embodiment of the present invention, together with a device under test (DUT) 10.

FIG. 1 illustrates an exemplary configuration of a test apparatus 100 relating to an embodiment of the present invention, together with a device under test (DUT) 10. The test apparatus 100 is designed to test at least one DUT 10. The DUT 10 is an analog circuit, a digital circuit, an analog/digital mixed circuit, a memory, or a system on chip (SOC). According to the illustrated example, the test apparatus 100 tests the DUT 10 in such a manner that a plurality of test modules 160, including a test module for performing an analog test, are controlled to operate in synchronization with each other at an intended timing. Furthermore, the test apparatus 100 tests the DUT 10 in such a manner that the test modules 160 are controlled to operate in synchronization with each together at an intended timing with the use of a plurality of synchronization modules 150.

The test apparatus 100 may test a plurality of DUTs 10 individually or in parallel. The test apparatus 100 includes a system control section 110, a hub 120, test control sections 130, a bus 140, a synchronization module 150, test modules 160, and a connection section 170.

The system control section 110 controls all of the constituents of the test apparatus 100. For example, the system control section 110 controls the test control sections 130, the synchronization module 150, and the test modules 160, in accordance with programs, instructions and the like supplied thereto from a user and the like. More specifically, the system control section 110 may acquire programs used for tests from storage devices, external computers such as workstations, and the like, or from the user's inputs, in order to control the operations of the test control sections 130. The system control section 110 may transmit control instructions and/or programs corresponding to a particular test to a corresponding test control section 130 via the hub 120.

The hub 120 provides communicative connection between the system control section 110 and at least one test control section 130. The hub 120 may relay the communication via a general-purpose or dedicated high-speed serial bus or the like. Exemplary general-purpose high-speed serial buses may include Ethernet®, a USB, a Serial RapidIO and the like.

Each test control section 130 executes a test control program to control the synchronization module 150 and the test modules 160, thereby testing the DUT 10. The test control section. 130 may control the synchronization module 150 and the test modules 160 in accordance with the control instructions and/or programs and the like supplied from the system control section 110. More specifically, the test control section 130 may generate control instructions to control the operations of the synchronization module 150 and the test modules 160 according to various tests. The test apparatus 100 may include a plurality of test control sections 130, for example, for the purpose of testing a plurality of DUTs 10, and each test control section 130 may independently perform a plurality of tests.

Each test control section 130 may perform tests on one or more DUTs. The test control section 130 may exchange data with at least one synchronization module 150 and at least one test module 160, via the bus 140. The test control section 130 may store in advance, on each test module 160, predetermined test programs, data patterns and the like according to the tests.

The bus 190 provides communicative connection among the test control sections 130, the synchronization module 150, and the test modules 160. The bus 140 may vary the connection with the synchronization module 150 and the test modules 160 according to a plurality of tests in a manner to optimize the number of modules that perform the tests. The bus 140 may change the connection with the synchronization module 150 and the test modules 160 according to the tests, by means of a plurality of bus switches.

The synchronization module 150 is connected to each of the test modules 160 and synchronizes the test modules 160 to each other. The test apparatus 100 may include two or more synchronization modules 150, which may be synchronized to each other in compliance with a master-slave relationship. Here, the synchronization modules 150 may synchronize with each other by directly exchanging synchronization signals. The synchronization module 150 may be mounted on a module connector of a test head together with the test modules 160.

Each test module 160 tests the DUT 10 based on the control signals from a corresponding test control section 130. The test apparatus 100 may have a plurality of types of test modules 160 mounted thereon according to a plurality of types of tests to be performed. Some of the test modules 160 may be digital modules that exchange digital signals with the DUT 10 to perform digital tests, or may be analog modules that exchange analog signals with the DUT 10 to perform analog tests.

Each test module 160 may be removable from the test apparatus 100. The test module 160 may operate in accordance with a clock synchronized with the test apparatus 100. Alternatively, the test module 160 may operate in accordance with a different clock that is generated by the DUT 10 or generated separately internally. The test module 160 exchanges test signals with the DUT 10 via the connection section 170. For example, the connection section 170 includes a motherboard, a performance board, and a socket.

Figure 2:
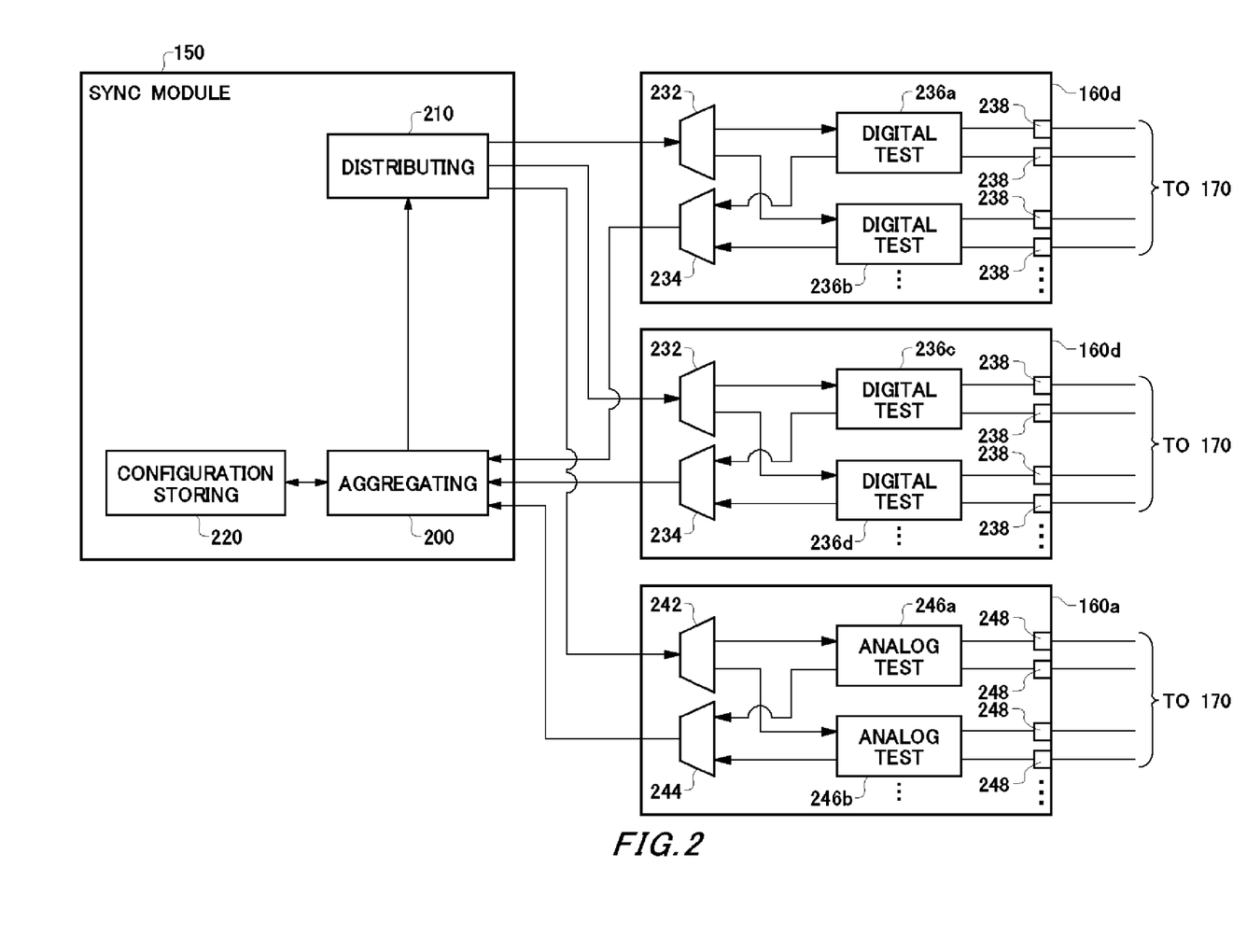
FIG. 2 illustrates exemplary configurations of a synchronization module 150 and test modules 160 included in the test apparatus 100 relating to the embodiment of the present invention.

FIG. 2 illustrates exemplary configurations of a synchronization module 150 and test modules 160 included in the test apparatus 100 relating to the embodiment of the present invention. According to the illustrated example, the test apparatus 100 includes one synchronization module 150, two digital test modules 160d that perform digital tests, and one analog test module 160a that performs analog tests. The following describes, as an example, the procedure of aggregating and distributing synchronization requests when the test apparatus 100 has the illustrated configuration.

Each of the test modules 160d, which perform digital tests, has one or more digital test sections 236 mounted thereon, multiplexes together synchronization requests from two or more digital test sections 236, and transmits the multiplexed synchronization request. Here, the test module 160d may transmit a synchronization request when one or more digital test sections 236 therein detect a failure during tests, start tests, and/or complete tests. The test module 160d may be a digital module including a demultiplexer 232, a multiplexer 234, digital test sections 236 and terminals 238.

The demultiplexer 232 receives a synchronization request from the synchronization module 150 and transmits synchronization requests to one or more corresponding digital test sections 236. Each digital test section 236 tests at least part of the interface of at least one DUT 10 via a plurality of terminals 238. The digital test section 236 operates in accordance with a test program supplied thereto to test the DUT 10.

For example, each digital test section 236 sequentially executes the respective instructions included in the supplied test program to perform operations corresponding to the respective instructions. For example, the test program may include a sequence indicating the order of outputting a plurality of data patterns supplied in advance to the digital test section 236. The digital test section 236 may include a sequencer that outputs the data patterns in the order determined by the sequence.

The data patterns may designate the logic values to be supplied to the respective pins of the DUT 10 in units of a single bit or a predetermined number of bits. The data patterns may designate the logic values to be supplied to the respective pins of the DUT 10 for a plurality of cycles to realize predetermined test functions.

Each digital test section 236 may judge the acceptability of the DUT 10 by comparing the signal received from the DUT 10 with an expected value. The digital test section 236 generates the expected value in a similar manner as the patterns to be supplied to the DUT 10. The multiplexer 234 multiplexes synchronization signals from digital test sections 236 connected thereto, and transmits the multiplexed synchronization signal to the synchronization module 150.

The test module 160a, which performs analog tests, has one or more analog test sections 246 mounted thereon, converts synchronization requests from the analog test sections 246 into digital signals, multiplexes the digital signals together, and transmits the multiplexed synchronization request. The test module 160a may transmit a synchronization request when the analog test sections 246 detect a failure during tests, start tests, and/or complete tests. The test module 160a may be an analog module including a demultiplexer 242, a multiplexer 244, analog test sections 246, and terminals 248.

The demultiplexer 242 receives a digital signal, which is a control signal from the synchronization module 150, and transmits the control signal in pulses to one or more corresponding analog test sections 246. Each analog test section 246 tests at least part of the interface of at least one DUT 10 via a plurality of terminals 238.

For example, each analog test section 246 may test the DUT 10 through operations in accordance with the clock generated internally within the analog test section 246. The analog test section 246 may start a test operation in response to a trigger signal supplied in pulses from the synchronization module 150. The analog test section 246 may transmit a predetermined analog signal to the DUT 10, to measure and record the analog waveform, the voltage, the current and the like of the DUT 10. The analog test section 246 may judge the acceptability of the DUT 10 based on the results of measuring the DUT 10. The analog test section 246 may output the recorded analog measured values to a corresponding test control section 130 based on a control signal from the test control section 130.

The analog signal may be a DC signal designating the voltage value and/or the current value to be supplied to the pins of the DUT 10 or a periodic signal or the like having a predetermined frequency or waveform to be supplied to the pins of the DUT 10. Alternatively, the analog signal may designate a predefined range of voltage values, current values, wave height values and/or frequency values to be supplied to the pins of the DUT 10.

Each analog test section 246 may measure the analog value output from a predetermined pin of the DUT 10. The analog value may be a voltage value, a current value, a wave height value, and/or a frequency. The analog test section 246 may judge the acceptability of the DUT 10 by comparing the measured analog value with an expected value and/or a range of expected values. The multiplexer 244 multiplexes together the trigger signals and the like from the analog test sections 246 connected thereto and transmits the multiplexed trigger signal to the synchronization module 150.

Each digital test section 236 and/or each analog test section 246 may perform a separate test based on a test program. Alternatively, two or more digital test sections 236 and/or analog test sections 246 may synchronously operate based on a test program to perform a single test on the digital input/output and the analog input/output of one or more DUTs 10. In this case, the two or more test sections may be configured to form a domain in which test sections synchronously operate, in association with a predetermined test performed by the test apparatus 100.

The digital test sections 236 and/or analog test sections 246 may start tests on the DUT 10 in response to reception of a synchronization request from the synchronization module 150. The digital test sections 236 and/or analog test sections 246 may transmit a synchronization request to the synchronization module 150 in response to completion of a predetermined test. In this case, the test sections may remain suspended or idle until receiving the next synchronization request from the synchronization module 150.

Based on a synchronization signal received from a digital module, which is a test module 160 exchanging digital signals with the DUT 10, the synchronization module 150 synchronizes, to the digital module, an analog module, which is a test module 160 performing an analog test on the DUT 10. Here, the synchronization module 150 may synchronize, to the clock of the test apparatus 100, at least one test section included in each of a plurality of domains, which each include one or more of the digital and analog test sections 236 and 246.

To perform a single type of test, the test apparatus 100 may configure a domain including one or more test sections. In this case, the synchronization module 150 may synchronize together the test sections included in each domain. The synchronization module 150 includes an aggregating section 200, a distributing section 210 and a configuration storing section 220.

The aggregating section 200 aggregates synchronization signals received from one or more of the test modules 160, to generate an aggregated synchronization signal. The aggregating section 200 may aggregate synchronization signals received from one or more test modules 160 by using a condition selected according to the configuration from conditions including logical AND condition and logical OR condition. The aggregating section 200 may aggregate, in units of domains, synchronization requests from test sections included in the test modules 160 connected to the synchronization module 150. The aggregating section 200 transmits to the distributing section 210 the aggregated synchronization request associated with each domain.

The distributing section 210 distributes a control signal instructing operations corresponding to the aggregated synchronization signal to a test module 160 to be controlled. The distributing section 210 may transmit, to digital modules and/or analog modules, a control signal corresponding to an aggregated synchronization signal that is generated by aggregating synchronization signals received from digital modules and/or analog modules to synchronize together the digital modules and/or analog modules.

When the to-be-controlled test module 160 is a digital module, the distributing section 210 may transmit the control signal in packets or pulses. When the to-be-controlled test module 160 is an analog module, the distributing section 210 may transmit the control signal in pulses. With the above-discussed configuration, the test apparatus 100 can have analog and digital test modules 160 mixed and mounted thereon.

The configuration storing section 220 stores, within the synchronization module 150, the configurations of two or more domains that can be configured. The configuration storing section 220 may store, as the domains, a variety of combinations of the digital and/or analog test sections 236 and 246. The aggregating section 200 may aggregate synchronization requests based on the domain information stored on the configuration storing section 220. The distributing section 210 may distribute synchronization requests based on the domain information stored on the configuration storing section 220. The domain information, which represents combinations of the test sections, may be designated by the test control sections 130 or by the respective test sections in accordance with the test programs supplied thereto from the test control sections 130.

A digital module, which is a test module 160, may operate in synchronization with the clock of the test apparatus 100 and transmit to the synchronization module 150, as a synchronization signal, a clock signal generated by referring to the clock of the test apparatus 100. The synchronization module 150 transmits the received clock signal to an analog module, which is a test module 160. Here, the analog module may operate with reference to an internal clock generated internally. The analog module may adjust the phase of the internal clock by referring to the clock signal received via the synchronization module 150. In this manner, the digital and analog modules, which are test modules 160, can perform tests substantially in synchronization with the clock of the test apparatus 100.

Alternatively, the digital module may transmit a trigger signal indicating the timing of an analog test on the DUT 10 to the synchronization module 150 as a synchronization signal, the synchronization module 150 may transmit the received trigger signal to the analog module, which is a test module 160, and the analog module may start and end the analog test with reference to the trigger signal. Here, note that the digital module operates in synchronization with the clock of the test apparatus 100. Considering this, if the analog module performs the analog test with reference to the trigger signal from the digital module, the digital and analog modules can perform test operations substantially in synchronization with the clock of the test apparatus 100.

Furthermore, the analog module may transmit to the synchronization module 150 a trigger signal indicating that a predetermined state is obtained during an analog test of the DUT 10, the synchronization module 150 may transmit the trigger signal to the digital module, and the digital module may test the DUT 10 with reference to the trigger signal. Here, the analog module may transmit the trigger signal to the synchronization module 150 in response to the measured value taking a predetermined value, the completion of the measurement, the preparation for measurement being ready or the like.

The analog module may transmit the trigger signal in pulses or the like to the synchronization module 150. Alternatively, the analog module may transmit to the synchronization module 150 a clock signal generated within the analog module.

The synchronization module 150, which operates in synchronization with the clock of the test apparatus 100, receives the trigger signal and transmits the received trigger signal to the digital module. Therefore, the digital module can perform a test on the DUT 10 with reference to the trigger signal while operating in synchronization with the clock of the test apparatus 100. Here, the synchronization signals and the control signals exchanged between the synchronization module 150 and the test modules 160 may be in packets and pulses when the test modules 160 are digital modules and may be pulses when the test modules 160 are analog modules.

Figure 3:
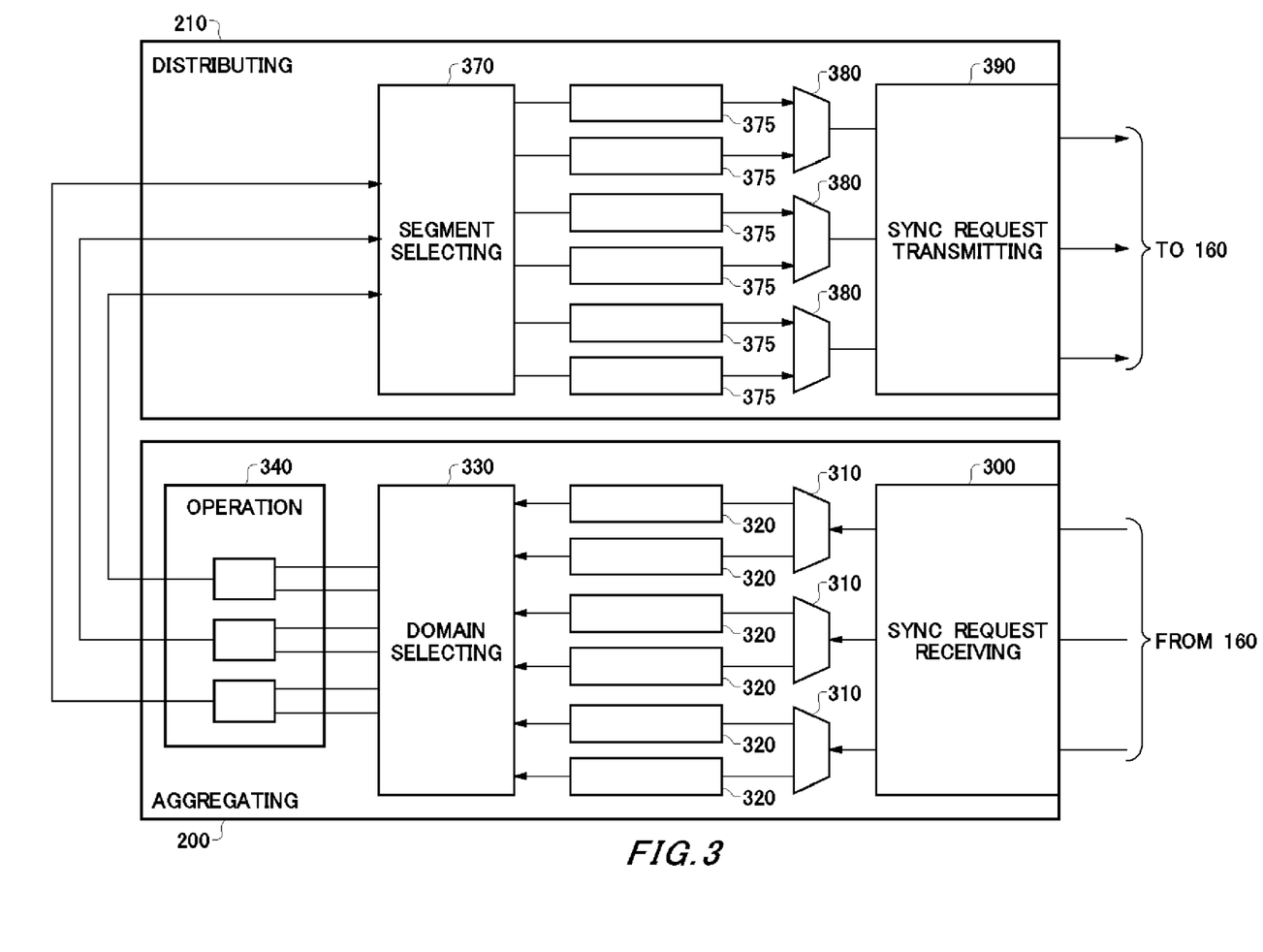
FIG. 3 illustrates exemplary configurations of an aggregating section 200 and a distributing section 210 of the synchronization module 150 relating to the embodiment of the present invention.

FIG. 3 illustrates exemplary configurations of the aggregating section 200 and the distributing section 210 of the synchronization module 150 relating to the embodiment of the present invention. The aggregating section 200 includes a synchronization request receiving section 300, demultiplexer sections 310, segments 320, a domain selecting section 330, and a local operation section 340.

The synchronization request receiving section 300 is connected to the test modules 160. Each test module 160 time-division multiplexes the synchronization requests from the test sections in the test module 160 and transmits the multiplexed synchronization request to the synchronization request receiving section 300. The synchronization request receiving section 300 transmits the received synchronization request to the demultiplexer sections 310.

The demultiplexer sections 310 demultiplex the multiplexed synchronization request from each test module 160 to output the synchronization requests from the respective test sections within the test module 160. The demultiplexer sections 310 output the synchronization requests from the respective test sections to corresponding signal lines. Therefore, the respective segments 320, which are the minimum synchronization request units, output onto the respective signal lines from the demultiplexer sections 310 are equivalent to the synchronization requests output respectively from the test sections.

The domain selecting section 330 aggregates in units of domains the segments 320 output from the demultiplexer sections 310 and transmits the aggregated segments to the operation section 340. The domain selecting section 330 may aggregate the segments 320 in units of domains by referring to the domain information stored on the configuration storing section 220. For example, the domain information may be in the bitmap format and indicates in association with each domain one or more segments 320 belonging to the domain.

The operation section 340 performs an operation on the synchronization requests corresponding to the segments 320 that are aggregated together in association with each domain. For example, the operation section 340 may aggregate the synchronization requests from the digital and/or analog test sections 236 and 246 included in each domain, by using one of logical AND condition and logical OR condition that is selected according to the configuration.

For example, when using logical AND condition, the operation section 340 transmits a synchronization request to the distributing section 210 in response to all of the test sections included in a domain transmitting synchronization requests. Therefore, logical AND condition may be employed, for example, in a case where a synchronization request is desired to be transmitted in response to all the test sections within a particular domain completing tests, so that the next test is performed.

As another example, when using logical OR condition, the operation section 340 transmits a synchronization request to the distributing section 210 in response to one or more of the test sections included in a domain transmitting synchronization requests. Therefore, logical OR condition may be employed, for example, in a case where a synchronization request is desired to be transmitted in response to at least one of the test sections in a particular domain detects a failure during a test so that the next test is performed.

As yet another example, when using logical AND condition to aggregate the synchronization requests from one or more digital test sections 236 within a domain, the operation section 340 transmits a synchronization request to the distributing section 210 in response to all of the one or more digital test sections 236 within the domain transmitting the synchronization requests. Therefore, this use of logical AND condition may be employed, for example, in a case where a synchronization request is desired to be transmitted in response to one or more digital test sections 236 within a particular domain completing tests so that a test by other digital test sections 236 within the domain and/or an analog test by the analog test sections 246 in the domain are performed.

As yet another example, when using logical AND condition to aggregate the synchronization requests from one or more analog test sections 246 within a domain, the operation section 340 transmits a synchronization request to the distributing section 210 in response to all of the one or more analog test sections 246 within the domain transmitting the synchronization requests. Therefore, this use of logical AND condition may be employed, for example, in a case where a synchronization request is desired to be transmitted in response to one or more analog test sections 246 within a particular domain completing tests so that an analog test by other analog test sections 246 within the domain and/or a test by the digital test sections 236 in the domain are performed.

The distributing section 210 includes a segment selecting section 370, segments 375, multiplexer sections 380, and a synchronization request transmitting section 390. The segment selecting section 370 may receive an aggregated synchronization request associated with each domain from the aggregating section 200 and select one or more segments 375 corresponding to target test modules 160, and the synchronization module 150 outputs synchronization requests to the target test modules 160.

Here, the segment selecting section 370 may output synchronization requests to segments 375 corresponding to all of the test modules 160 or predetermined test modules 160. The segment selecting section 370 may select appropriate segments 375 by referring to the domain information stored on the configuration storing section 220.

The multiplexer sections 380 multiplex the synchronization requests in association with each test module 160. The multiplexer sections 380 time-division multiplex the synchronization requests associated with each test module 160 and transmits the multiplexed synchronization request to the synchronization request transmitting section 390. The synchronization request transmitting section 390 transmits the multiplexed synchronization request generated by the multiplexer sections 380 to the corresponding test module 160.

As described above with reference to the illustrated exemplary configurations, the test apparatus 100 aggregates synchronization requests, which are transmitted from a plurality of test sections, in association with each domain, distributes the aggregated synchronization requests into synchronization requests, which are to be associated with each test module 160, and transmits each synchronization request to the associated test module 160. In this manner, the test apparatus 100 synchronizes the operations of a plurality of test sections in each of a plurality of domains which are defined by combining test sections in various manners according to test programs.

Figure 4:
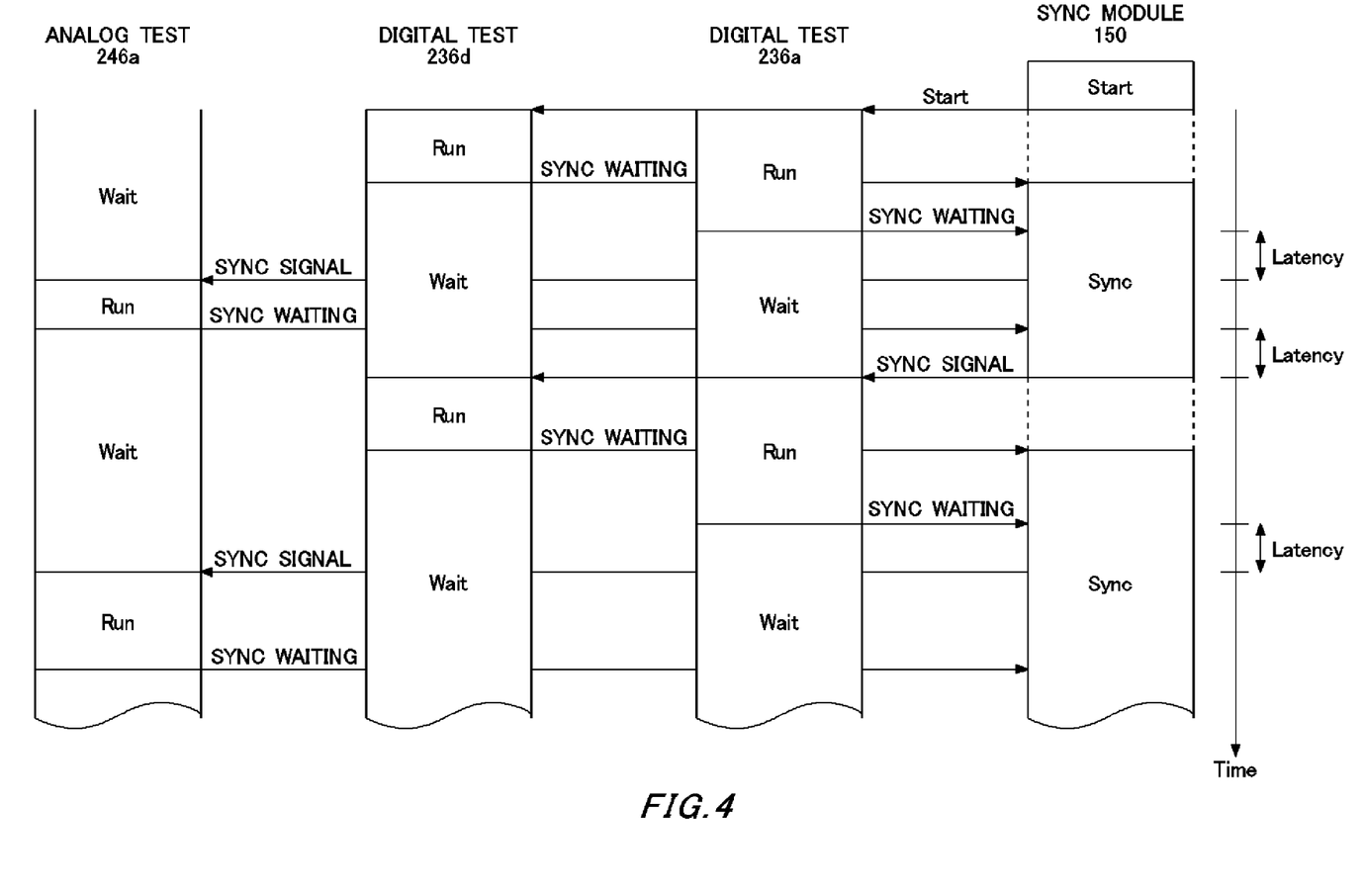
FIG. 4 is a timing chart illustrating exemplary operations of the test apparatus 100 relating to the embodiment of the present invention.

FIG. 4 is a timing chart illustrating exemplary operations of the test apparatus 100 relating to the embodiment of the present invention. According to the illustrated example, three test sections 236a, 236d, and 246a included in a domain are controlled to synchronously operate. According to a different example, a different number of test sections may form a domain and be controlled to be synchronized with each other in the test apparatus 100. According to the present example, it is desired that the analog test section 246a performs a test in response to the digital test sections 236a and 236d completing tests.

The test control sections 130 designate a domain including the test sections 236a, 236d and 246a. Here, the domain information may be stored in the configuration storing section 220 within the synchronization module 150. Similarly, the test control sections 130 may designate an operation to be employed by the operation section 340 and store the operation onto the configuration storing section 220 in order that an analog test is performed in response to completion of digital tests within the domain. The test control sections 130 may store in advance test programs and data patterns onto the test sections.

The synchronization module 150 synchronously supplies, to target test sections within the test modules 160 connected thereto, start signals (Start), which cause the test sections to start executing test programs. For example, the synchronization module 150 synchronously supplies, to the digital test sections 236a and 236d, start signals (Start), which cause the test sections to start executing test programs. In response to the start signals, the digital test sections 236a and 236d start executing the test programs (Run). Here, each test program may include a plurality of test blocks.

The digital test sections 236a and 236d transition to a synchronization waiting state (Wait) when satisfying a predetermined condition during the execution of the test programs. For example, the test sections transition to the synchronization waiting state (Wait) when each test block is completed. Here, each test block may be completed when a result from the DUT 10 satisfies a predetermined condition.

In response to the transition into the synchronization waiting state (Wait) during execution of a corresponding test program, each test section communicates to the synchronization module 150 a synchronization waiting command, which is a synchronization request. Each test section preferably transitions into the synchronization waiting state (Wait) after communicating the synchronization waiting command to the synchronization module 150. When released from the synchronization waiting state, each test section starts the next test block (Run).

The synchronization module 150 detects whether having received synchronization waiting commands from all of one or more predetermined test sections, from among the test sections included in the domain. Here, the synchronization module 150 is notified in advance of which are the predetermined test sections from among the test sections included in the domain. For example, a test block executed by one of the test sections may include an instruction to notify the synchronization module 150 of the predetermined test sections. According to the present example, the predetermined test sections are the two digital test sections 236a and 236d.

On condition that the synchronization module 150 receives synchronization waiting commands from the two digital test sections 236a and 236d, the synchronization module 150 synchronously supplies to the analog test section 246a a synchronization signal releasing the analog test section 246a from the synchronization waiting state. Specifically speaking, in the synchronization module 150, the domain selecting section 330 selects the synchronization requests from the digital test sections 236a and 236d and transmits the selected synchronization requests to the operation section 340 and the operation section 340 aggregates the synchronization requests by using logical AND condition. Furthermore, in the synchronization module 150, the aggregated synchronization request from the operation section 340 is transmitted to the segment selecting section 370, and the segment selecting section 370 selects a segment 375 corresponding to the analog test section 246a and transmits a synchronization request to the analog test section 246a. As a result, the synchronization module 150 transmits the synchronization request to the analog test section 246a via the synchronization request transmitting section 390.

The analog test section 246a starts a test on the DUT 10 in response to the reception of the synchronization request in pulses or the like. The analog test section 246a transitions to the synchronization waiting state (Wait) in response to the completion of the test and communicates a synchronization waiting command to the synchronization module 150. The synchronization module 150 aggregates together the synchronization request from the analog test section 246a and the result of aggregating the synchronization requests from the digital test sections 236a and 236d. In the illustrated example, this aggregation may be performed by using logical AND condition. The synchronization module 150 transmits, to the digital test sections 236a and 236d, the result of aggregating the synchronization requests from the digital test sections 236a and 236d and the analog test section 246a.

In response to receiving from the synchronization module 150 the result of aggregating the synchronization requests, the digital test sections 236a and 236d start executing the next test program (Run). As described above, on condition that the synchronization module 150 relating to the present example receives a synchronization request from a predetermined test section within a particular domain, the synchronization module 150 synchronously supplies a synchronization signal to a different predetermined test section within the domain.

The synchronization module 150 is notified in advance of which test section is to start a test in response to a predetermined test section completing a test. For example, the synchronization module 150 may be notified of this information by the test control sections 130 according to test programs. Alternatively, the test control sections 130 may store the domain information including this information in advance on the configuration storing section 220.

When a predetermined time period (Latency) has elapsed after the synchronization module 150 receives the last synchronization request, the synchronization module 150 synchronously supplies a synchronization signal to a predetermined test section. The predetermined time period (latency) is preferably constant irrespective of the number of test sections that need to communicate a synchronization waiting command to the synchronization module 150. When receiving synchronization signals in synchronization with each other, a plurality of test sections each start executing the next test block in synchronization with each other.

By repeating the above-described control procedure, the test sections can synchronously start executing their corresponding test blocks. The test blocks the respective test sections should synchronously execute may be different from each other in terms of their contents and the time required to complete. For example, the test blocks the respective test sections should synchronously execute may have differently structured instruction sets or have instructions sets differing in the number of instructions. The test apparatus 100 relating to the present example can synchronize together the operations of the respective test sections during execution of test programs. Therefore, even if the respective test sections execute test blocks requiring different execution time periods, the operations of the test sections can be easily synchronized to each other at each test block.

Figure 5:
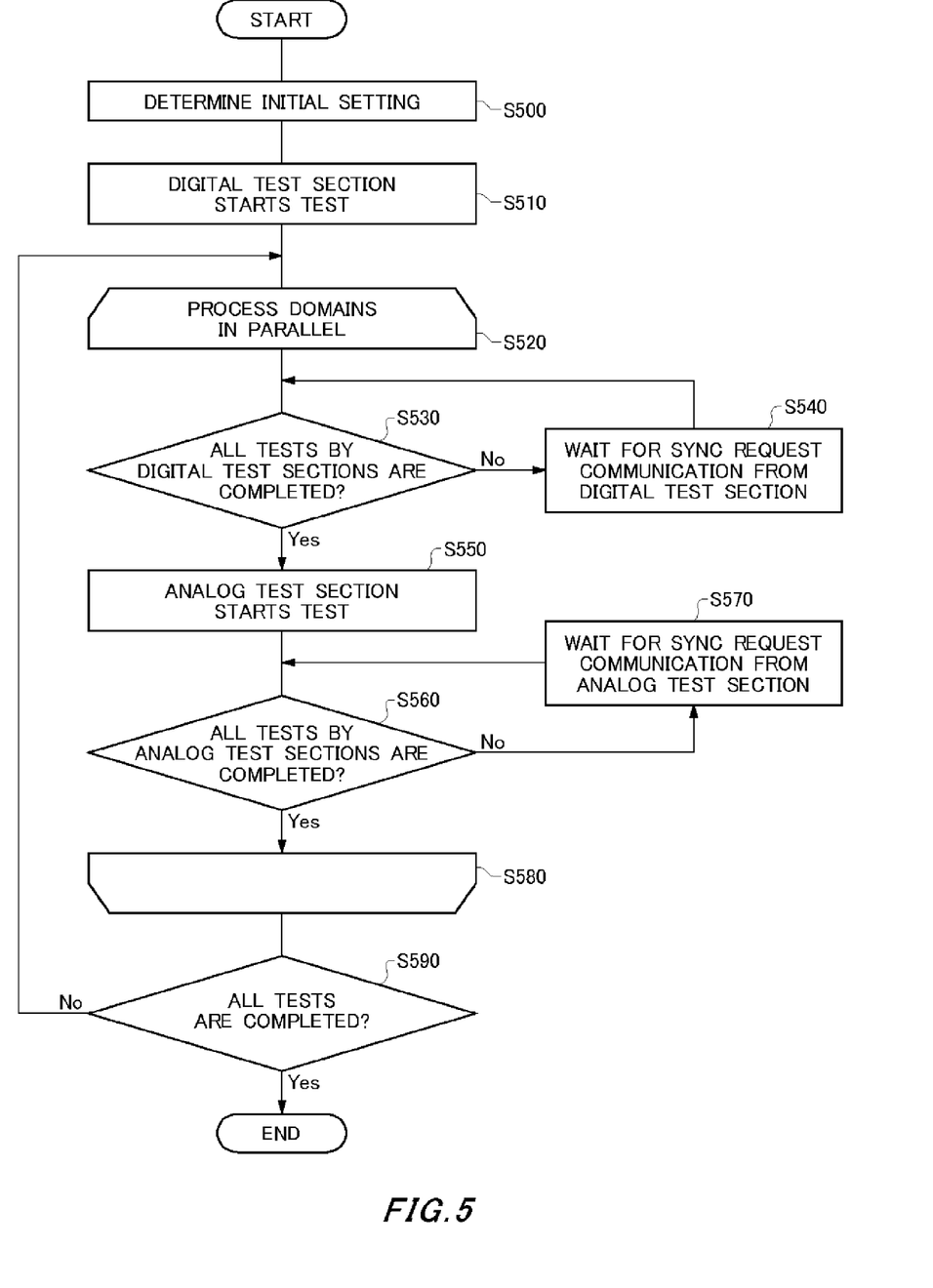
FIG. 5 is a flow chart illustrating the operations of the test apparatus 100 relating to the embodiment of the present invention.

FIG. 5 is a flow chart illustrating the operations of the test apparatus 100 relating to the embodiment of the present invention. The test apparatus 100 determines the initial settings such as parameters for tests (S500). For example, the test apparatus 100 may determine domain information in association with test programs. The test apparatus 100 may determine the operations to be performed by the operation section 340 in association with test programs. The test apparatus 100 may determine the selection conditions to be used by the domain selecting section 330 and the segment selecting section 370 based on the test sections constituting domains.

The test apparatus 100 causes the test sections to start tests according to test programs (S510). The test control sections 130 may control the test sections so that each domain separately performs tests according to test programs. According to the present example, the test apparatus 100 causes the digital test sections 236a and 236d to start tests.

The test apparatus 100 may cause the respective domains to perform tests sequentially or in parallel. In the illustrated steps S520 to S560, the respective domains perform tests in parallel. In an alternative case where each domain sequentially perform tests, the steps 5520 to S560 form a loop procedure for each domain.

According to the synchronization module 150 relating to the present example, the operation section 340 first performs a logical AND operation on the digital test sections 236a and 236d. In other words, the synchronization module 150 relating to the present example starts a synchronizing operation for the next tests in response to the completion of the tests at the digital test sections 236a and 236d within a domain. Therefore, the synchronization module 150 judges whether the digital test sections 236a and 236d in the domain have communicated the synchronization requests (S530). The synchronization module 150 repeats the communication waiting step S540 and the communication judging step S530 until the digital test sections 236a and 236d communicate the synchronization requests.

When the digital test sections 236a and 236d within the domain communicate the synchronization requests to the synchronization module 150, the synchronization module 150 causes the next test to be performed, which is a test by the analog test section 246a (S550). In other words, the synchronization module 150 aggregates the synchronization requests from the digital test sections 236a and 236d by using logical AND condition, and transmits the resulting aggregated synchronization request to the analog test section 246a.

In response to transmitting the aggregated synchronization request to the analog test section 246a, the synchronization module 150 configures the operation section 340 to perform logical AND condition on synchronization requests from the digital test sections 236a and 236d and the analog test section 246a. Similarly, in response to transmitting the aggregated synchronization request to the analog test section 246a, the synchronization module 150 changes the configuration of the segment selecting section 370 so that the segment selecting section 370 selects the digital test sections 236a and 236d.

The synchronization module 150 judges whether the analog test section 246a completes the test (S560). The synchronization module 150 repeats the communication waiting step S570 and the communication judging step S560 until the synchronization request is communicated from the analog test section 246a to the synchronization module 150. When the synchronization request is communicated from the analog test section 246a to the synchronization module 150, the synchronization module 150 causes the next test to be performed. In other words, the synchronization module 150 aggregates the synchronization requests from the digital test sections 236a and 236d and the analog test section 246a by using the logical AND condition and transmits the resulting aggregated synchronization request to the digital test sections 236a and 236d.

In response to transmitting the aggregated synchronization request to the digital test sections 236a and 236d, the synchronization module 150 configures the operation section 340 to perform logical AND condition on the digital test sections 236a and 236d. Similarly, in response to transmitting the aggregated synchronization request to the digital test sections 236a and 236d, the synchronization module 150 changes the configuration of the segment selecting section 370 so that the segment selecting section 370 selects the analog test section 246a.

In the described manner, the synchronization module 150 repeats the steps S520 to S580 until the domain completes the tests according to the test programs. When every domain completes the corresponding tests, the test control sections 130 judge that all the tests have been completed (S590). If there are other tests, the test control sections 130 control corresponding domains to continue performing tests by repeating the steps S520 to S580 according to test programs. Here, the test control sections 130 may reconfigure the domains and control the reconfigured domains to perform tests according to test programs.

When the test apparatus 100 utilizes a plurality of test control sections 130 to perform tests, the test control sections 130 may perform tests in parallel or sequentially in a case where the same test section is required to simultaneously perform tests. In this case, the test apparatus 100 refers to the domain information to judge whether the same test section is included in more than one domain. Based on this judgment, the test apparatus 100 may determine whether the test control sections 130 perform tests in parallel or sequentially. The test apparatus 100 may end tests in response to the test control sections 130 completes performing all tests.

In the test apparatus 100 relating to the embodiment of the present invention described above, a plurality of test sections including the digital test sections 236 and/or analog test sections 246 are organized into domains, and the test sections within each domain can perform their tests in synchronization with each other. In addition, synchronization can be achieved multiple times during execution of a single test program.

Figure 6:
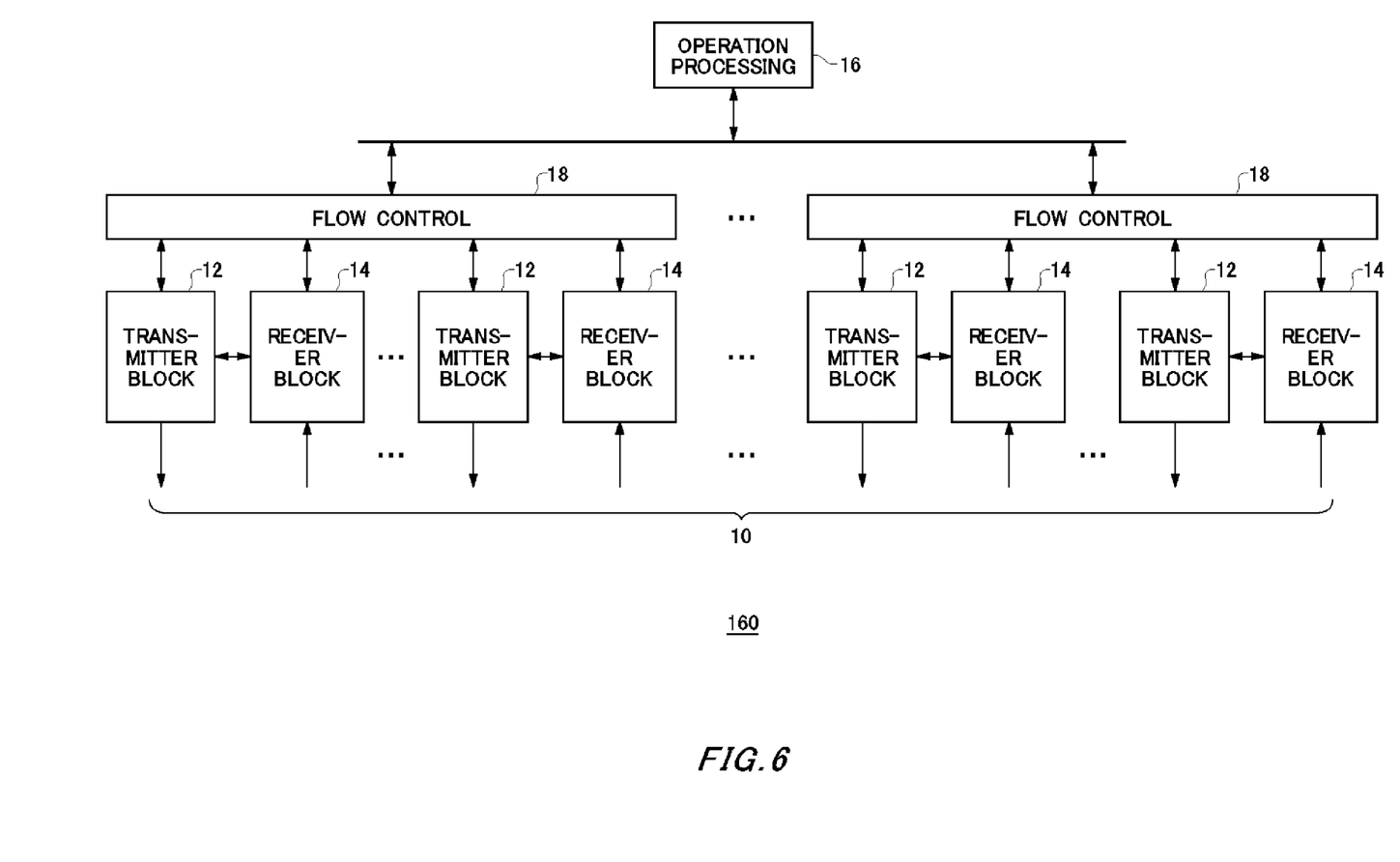
FIG. 6 illustrates an exemplary configuration of a digital module, which serves as the test module 160 relating to the embodiment of the present invention.

FIG. 6 illustrates an exemplary configuration of a digital module, which is a test modules 160 relating to the embodiment of the present invention. The test module 160 communicates packets with the DUT 10 according to test programs, to test the DUT 10.

For example, the test module 160 includes a plurality of transmitter blocks 12, a plurality of receiver blocks 14, an operation processing section 16, and a plurality of flow control sections 18. According to the present example, the test module 160 includes one hundred and twenty eight (128) transmitter blocks 12, one hundred and twenty eight (128) receiver blocks 14, one (1) operation processing section 16, and eight (8) flow control sections 18.

The transmitter blocks 12 and receiver blocks 14 are each connected to any one of the terminals of the DUT 10. Each of the transmitter blocks 12 is associated with any one of the receiver blocks 14. Each pair of a transmitter block 12 and a receiver block 14 associated with each other is associated with any one of the flow control sections 18. According to the present example, each of the eight flow control sections 18 is associated with eight transmitter blocks 12 and eight receiver blocks 14, which are associated with each other in a one-to-one correspondence.

Each pair of a transmitter block 12 and a receiver block 14 stores a plurality of packet lists each including a series of packets communicated between the pair and the DUT 10. Each pair of a transmitter block 12 and a receiver block 14 sequentially communicates to the DUT 10 a series of packets included in a packet list designated by a corresponding flow control section 18

The operation processing section 16 processes arithmetic expressions included in test programs. For example, the operation processing section 16 receives arguments for the arithmetic expressions from each flow control section 18, calculates the arithmetic expressions using the received arguments, and provides the calculation results to the corresponding flow control section 18.

Each flow control section 18 designates, according to the execution flows of test programs, the order of packet lists to be executed, to each of the pairs of a transmitter block 12 and a receiver block 14 associated therewith. For example, the flow control section 18 executes a branch instruction, a subroutine call instruction and the like included in the test programs and, based on the result of executing the instructions, designates to the associated pairs of the transmitter block 12 and the receiver block 14 a packet list to be next performed.

For example, each flow control section 18 receives the results of the communication between the DUT 10 and the associated pairs of the transmitter block 12 and the receiver block 14 and transmits the received communication results to the operation processing section 16 as the arguments for the arithmetic expressions. The flow control section 18 receives the result of calculating the arithmetic expressions from the operation processing section 16 and, based on the received calculation result, designates to the associated pairs of the transmitter block 12 and the receiver block 14 a packet list to be next executed.

In the test apparatus 100 having the above-described configuration, the operation processing section 16, which constitutes a superior component, calculates the arithmetic expressions within test programs, and the flow control sections 18, the transmitter blocks 12 and the receiver blocks 14, which constitute a subordinate component, perform flow control.

Thus, in the test apparatus 100, the operation processing section 16, which constituents a superior component, is implemented by using a high processing power processor so as to centrally manage variables, and the flow control sections 18, the transmitter blocks 12 and the receiver blocks 14, which constitute a subordinate component, are implemented by using high operation frequency processors or sequencers. In this manner, the test apparatus 100 can be configured as a highly efficient system as a whole.

According to the test apparatus 100 having the above-described configuration, when the same packet is communicated multiple times between the DUT 10 and the test modules 160, the common data can be designated multiple times to generate data strings. This can reduce the amount of data stored in the DUT 10.

Figure 7:
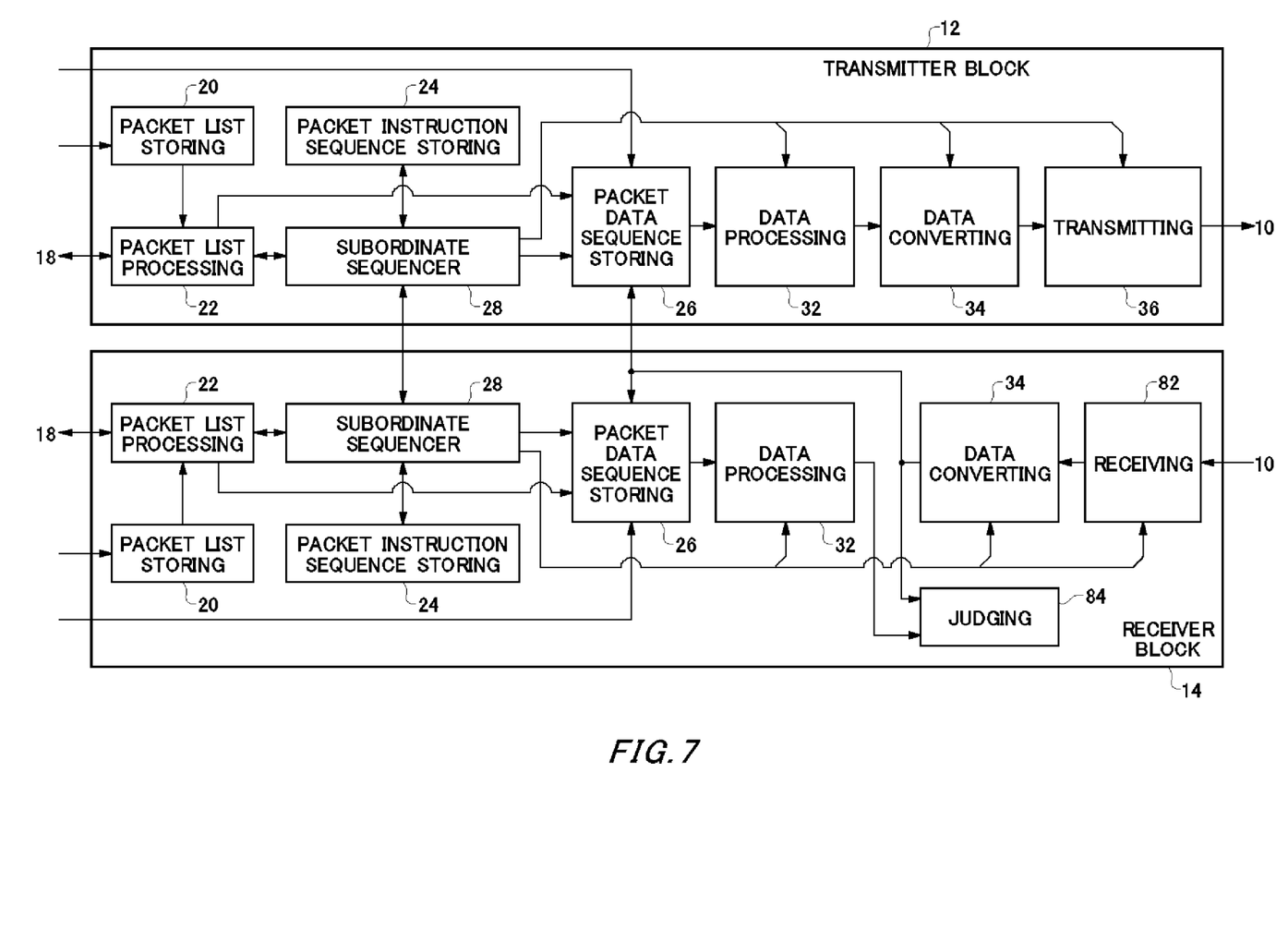
FIG. 7 illustrates exemplary configurations of a transmitter block 12 and a receiver block 14 relating to the embodiment of the present invention.

FIG. 7 illustrates exemplary configurations of the transmitter block 12 and the receiver blocks 14 relating to the embodiment of the present invention. The transmitter block 12 transmits to the DUT 10 packets in the order designated by a packet list. The receiver block 14 receives packets from the DUT 10, and compares the received packets against the packets designated by a packet list to judge the acceptability of the DUT 10.

The following first describes the transmitter block 12. The transmitter block 12 includes a packet list storing section 20, a packet list processing section 22, a packet instruction sequence storing section 24, a packet data sequence storing section 26, a subordinate sequencer 28, a data processing section 32, a data converting section 34, and a transmitting section 36. The packet list storing section 20 stores a plurality of packet lists supplied thereto.

The packet list processing section 22 executes a packet list designated by the flow control section 18, from among the packet lists stored on the packet list storing section 20, to sequentially designate the packets to be communicated with the DUT 10. For example, the packet list processing section 22 executes a packet list from the address received from the flow control section 18, to sequentially designate the packets to be transmitted to the DUT 10.

For example, the packet list processing section 22 designates an address on the packet instruction sequence storing section 24 on which an instruction sequence for generating the designated packet is stored. Furthermore, the packet list processing section 22 designates, for the packet to be communicated with the DUT 10, the address of the data sequence to be included in the packet (for example, the start address of the data sequence) within the packet data sequence storing section 26, for example.

In this way, the packet list processing section 22 separately designates the address of the instruction sequence for generating the packet and the address of the data sequence to be included in the packet. Here, when a particular packet list designates a common instruction sequence or data sequence for two or more packets, the packet list processing section 22 may designate the same instruction sequence address or data sequence address for the two or more packets.

The packet instruction sequence storing section 24 stores, in association with each of a plurality of packet types, an instruction sequence for generating a packet of that type. For example, the packet instruction sequence storing section 24 stores thereon an instruction sequence for generating a write packet, an instruction sequence for generating a read packet, an instruction sequence for generating an idle packet, and other instruction sequences.

The packet data sequence storing section 26 stores, in association with each of a plurality of packet types, a data sequence to be included in a packet of that type. For example, the packet data sequence storing section 26 may include a data sequence to be included in a write packet, a data sequence to be included in a read packet, a data sequence to be included in an idle packet, and other data sequences. For example, the packet data sequence storing section 26 may have separate storage regions for separately storing unique data different for each packet and common data common to all types of packets.

The packet data sequence storing section 26 of the transmitter block 12 receives, from a data converting section 39 of the receiver block 14, data included in a packet received by a receiving section 82 of the receiver block 14. The packet data sequence storing section 26 of the transmitter block 12 then stores the received data included in the packet received by the receiving section 82 of the receiver block 14.

The subordinate sequencer 28 reads from the packet instruction sequence storing section 24 an instruction sequence for a packet designated by the packet list processing section 22, in other words, an instruction sequence addressed by the packet list processing section 22, and sequentially executes the instructions included in the read instruction sequence. Furthermore, the subordinate sequencer 28 causes the packet data sequence storing section 26 to sequentially output a data sequence for the packet designated by the packet list processing section 22, in other words, a data sequence addressed by the packet list processing section 22, in accordance with the executed instruction sequence, in order to generate a test data sequence to be used for testing the DUT 10.

Upon execution of each instruction, the subordinate sequencer 28 provides the data processing section 32 and the data converting section 34 with control data that instructs the data processing section 32 and the data converting section 34 to perform designated processing (operations or data conversion) on the read unique data and common data. In this manner, the subordinate sequencer 28 can provide data that has been generated by performing designated processing on the read data, for a designated data portion in the packet designated by the packet list processing section 22.

In response to completion of the execution of the instruction sequence for the packet designated by the packet list processing section 22, the subordinate sequencer 28 may supply completion notification to the packet list processing section 22. In this manner, the packet list processing section 22 can sequentially designate packets in accordance with the development of the execution of the instruction sequence by the subordinate sequencer 28.

The subordinate sequencer 28 of the transmitter block 12 designates, to the transmitting section 36, the edge timing of the signal to be transmitted to the DUT 10. For example, the subordinate sequencer 28 supplies a timing signal to the transmitting section 36 in order to control the edge timing of each packet.

The subordinate sequencer 28 of the transmitter block 12 communicates with the subordinate sequencer 28 of the receiver block 14. With such a configuration, the subordinate sequencer 28 of the transmitter block 12 performs a handshake with the subordinate sequencer 28 of the receiver block 14 to execute an instruction sequence in synchronization with the subordinate sequencer 28 of the receiver block 14.

For example, the subordinate sequencer 28 of the transmitter block 12 notifies the subordinate sequencer 28 of the receiver block 14 of having transmitted to the DUT 10 a test data sequence for a pre-designated packet. In this manner, the subordinate sequencer 28 of the transmitter block 12 can prohibit the subordinate sequencer 28 of the receiver block 14 from making a judgment on the acceptability based on a received data sequence until receiving a notification from the subordinate sequencer 28 of the transmitter block 12.

For example, the subordinate sequencer 28 of the transmitter block 12 generates a test data sequence for a pre-designated packet on reception of notification from the subordinate sequencer 28 of the receiver block 14 indicating that a data sequence matching the generated test data sequence has been received. In this manner, the subordinate sequencer 28 of the transmitter block 12 can transmit to the DUT 10 a pre-designated packet after a predetermined packet is received from the DUT 10.

The data processing section 32 reads from the packet data sequence storing section 26 a data sequence for the packet designated by the packet list processing section 22 to generate a test data sequence used for testing the DUT 10. Here, the data processing section 32 of the transmitter block 12 may insert, into the test data sequence corresponding to the packet to be transmitted to the DUT 10, a value corresponding to the received data included in the packet received by the receiving section 82 of the receiver block 14.

For example, the data processing section 32 of the transmitter block 12 reads data from the packet data sequence storing section 26 of the transmitter block 12 to generate a test data sequence by adjusting a pre-designated portion for the data sequence of the packet to be transmitted to the DUT 10 to have a value corresponding to the received data (for example, the value of the received data or the value obtained by subjecting the received data to some processing). With the data processing section 32 of the transmitter block 12 being configured in such a manner, it is possible to transmit a packet including the value corresponding to the received data included in the packet received from the DUT 10.

The data converting section 34 converts the data of the test data sequence output from the data processing section 32 at the timing designated by the subordinate sequencer 28. For example, the data converting section 34 subjects the test data sequence to 8B/10B conversion and the like by means of a preset table and the like. Furthermore, the data converting section 34 may subject the test data sequence to scrambling processing, for example. The data converting section 34 then outputs the converted data sequence.

The transmitting section 36 transmits the test data sequence generated by the data converting section 34 to the DUT 10.

The following now describes the receiver block 14. Since the receiver block 14 has substantially the same constituents and functions as the transmitter block 12, the following description of the receiver block 14 focuses on the difference between the receiver block 14 and the transmitter block 12.

The receiver block 14 includes a packet list storing section 20, a packet list processing section 22, a packet instruction sequence storing section 24, a packet data sequence storing section 26, a subordinate sequencer 28, a data processing section 32, a data converting section 34, a receiving section 82, and a judging section 84. The receiving section 82 receives a data sequence for a packet from the DUT 10.

The data converting section 34 of the receiver block 14 converts the data of the data sequence received by the receiving section 82 at the timing designated by the subordinate sequencer 28 of the receiver block 14. For example, the data converting section 34 of the receiver block 14 subjects the received data sequence to 8B/10B conversion and the like by means of a preset table and the like. Furthermore, the data converting section 34 of the receiver block 14 may subject the received data sequence to descrambling processing, for example.

The data converting section 34 of the receiver block 14 supplies the converted data sequence to the judging section 84. The data converting section 34 of the receiver block 14 may supply the converted data sequence to at least one of the packet data sequence storing section 26 of the receiver block 19 and the packet data sequence storing section 26 of the transmitter block 12.

The packet list processing section 22 of the receiver block 14 executes a packet list designated by the flow control section 18 to sequentially designate the packets that are expected to be received from the DUT 10. The data processing section 32 of the receiver block 14 supplies the generated test data sequence to the judging section 84.

The subordinate sequencer 28 of the receiver block 14 causes the packet data sequence storing section 26 of the receiver block 14 to output, as the test data sequence, a data sequence for a packet that is expected to be output from the DUT 10. The subordinate sequencer 28 of the receiver block 14 designates, to the receiving section 82, a strobe timing for acquiring a data value of the signal output from the DUT 10.

The judging section 84 receives the test data sequence from the data processing section 32 of the receiver block 14 as well as the received data sequence from the data converting section 34 of the receiver block 14. The judging section 84 compares the received data sequence with the test data sequence and, based on the result of the comparison, judges the acceptability of the communication with the DUT 10. For example, the judging section 84 includes a logic comparing section that compares the data sequence received at the receiving section 82 with the test data sequence to judge whether a match is found, and a fail memory that stores the result of the comparison. For example, the judging section 84 may notify the subordinate sequencer 28 of the receiver block 14 of a match between the data sequence received at the receiving section 82 and the designated data sequence.

The subordinate sequencer 28 of the receiver block 14 communicates with the subordinate sequencer 2E of the transmitter block 12. With such a configuration, the subordinate sequencer 28 of the receiver block 14 performs a handshake with the subordinate sequencer 28 of the transmitter block 12 to execute an instruction sequence in synchronization with the subordinate sequencer 28 of the transmitter block 12.

For example, the subordinate sequencer 28 of the receiver block 14 notifies the subordinate sequencer 28 of the transmitter block 12 of a match between a received data sequence and the test data sequence generated by the subordinate sequencer 28 of the receiver block 14. With this configuration, the subordinate sequencer 28 of the transmitter block 12 can generate a test data sequence for a pre-designated packet in response to receiving from the subordinate sequencer 28 of the receiver block 14 the notification indicating that the received data sequence matches the generated test data sequence.

For example, the subordinate sequencer 28 of the receiver block 14 prohibits the judging section 84 from making a judgment on the acceptability based on the data sequence received by the receiving section 82 until receiving from the subordinate sequencer 28 of the transmitter block 12 notification indicating that a test data sequence for a pre-designated packet is transmitted to the DUT 10. With such a configuration, after a predetermined packet is transmitted to the DUT 10, the subordinate sequencer 28 of the receiver block 14 can judge whether the DUT 10 outputs a response corresponding to the transmitted predetermined packet.

The packet data sequence storing section 26 of the receiver block 14 receives from the data converting section 34 of the receiver block 14 received data included in the packet received by the receiving section 82. The packet data sequence storing section 26 of the receiver block 14 stores the received data included in the packet received by the receiving section 82.

Furthermore, the data processing section 32 of the receiver block 14 inserts, into the test data sequence included in the packet that is expected to be output from the DUT 10, a value corresponding to the received data included in the packet having been received at the receiving section 82. For example, the data processing section 32 of the receiver block 14 reads data from the packet data sequence storing section 26 of the receiver block 14 and generates a test data sequence by adjusting a pre-designated portion of the data sequence of the packet that is expected to be received from the DUT 10 to have a value corresponding to the received data (for example, the value of the received data or the value obtained by performing some processing on the received data).

For example, the data processing section 32 of the receiver block 14 may insert, into the test data sequence corresponding to a second packet that is expected to be received from the DUT 10, a value corresponding to the received data included in a first packet that has already been received at the receiving section 82. With the data processing section 32 of the receiver block 14 being configured in such a manner, it is possible to refer to the ID and the like included in the packet received from the DUT 10 to judge whether the IDs included in the subsequent packets are correct, for example.

As described above, the test apparatus 100 relating to the embodiment of the present invention can perform a processing of inserting a value corresponding to received data included in a received packet into subsequent packets, at a location relatively near the DUT 10. Thus, the test apparatus 100 can exchange responses with the DUT 10 at high speed.

The test apparatus 100 preferably includes the data processing section 32 that is implemented by an operation processing unit having a relatively high operation frequency. In this manner, the test apparatus 100 can generate, based on the data included in a received packet, data to be contained in subsequent packets at high speed.

Although some aspects of the present invention have been described by way of exemplary embodiments, it should be understood that those skilled in the art might make many changes and substitutions without departing from the spirit and the scope of the present invention which is defined only by the appended claims.

The claims, specification and drawings describe the processes of an apparatus, a system, a program and a method by using the terms such as operations, procedures, steps and stages. When a reference is made to the execution order of the processes, wording such as "before" or "prior to" is not explicitly used. The processes may be performed in any order unless an output of a particular process is used by the following process. In the claims, specification and drawings, a flow of operations may be explained by using the terms such as "first" and "next" for the sake of convenience. This, however, does not necessarily indicate that the operations should be performed in the explained order.

What is claimed is:

1. A test apparatus for testing a device under test, comprising:
    a plurality of test modules that test the device under test;
    a synchronization module that is connected to each of the plurality of test modules, the synchronization module synchronizing together the plurality of test modules and including:

an aggregating section that aggregates synchronization signals received from one or more of the plurality of test modules to generate an aggregated synchronization signal; and a distributing section that distributes a control signal indicating an operation corresponding to the aggregated synchronization signal to a to-be-controlled test module of the plurality of test modules, wherein the synchronization module synchronizes an analog module to a digital module by transmitting to the analog module a control signal corresponding to an aggregated synchronization signal generated by aggregating a synchronization signal received from the digital module, and the digital module is one of the plurality of test modules that exchanges a digital signal with the device under test, and the analog module is one of the plurality of test modules that performs an analog test on the device under test.

2. The test apparatus as set forth in claim 1, wherein the aggregating section aggregates the synchronization signals received from the test modules by using a logical condition selected according to a configuration from logical conditions including a logical AND condition and a logical OR condition.

3. The test apparatus as set forth in claim 1, wherein the digital module operates in synchronization with a clock of the test apparatus and transmits to the synchronization module, as the synchronization signal, a clock signal generated with reference to the clock of the test apparatus, the synchronization module transmits the clock signal to the analog module, and the analog module operates with reference to an internal clock generated therein, and adjusts a phase of the internal clock based on the clock signal received via the synchronization module.

4. The test apparatus as set forth in claim 1, wherein the digital module transmits to the synchronization module, as the synchronization signal, a trigger signal indicating a timing of an analog test on the device under test, the synchronization module transmits the trigger signal to the analog module, and the analog module performs the analog test with reference to the trigger signal.

5. The test apparatus as set forth in claim 1, wherein the analog module transmits to the synchronization module a trigger signal indicating that a predetermined state is obtained during an analog test on the device under test, the synchronization module transmits the trigger signal to the digital module, and the digital module performs a test on the device under test with reference to the trigger signal.

6. The test apparatus as set forth in claim 1, wherein the distributing section:

transmits the control signal in packets when the to-be-controlled test module is the digital module, and transmits the control signal in pulses when the to-be-controlled test module is the analog module.

7. The test apparatus as set forth in claim 1, wherein each of the test modules includes a plurality of test sections, the synchronization module further includes a configuration storing section that stores a plurality of configurations of domains, the domains representing combinations of the test sections, and the aggregating section aggregates synchronization requests based on the configurations stored in the configuration storing section.

8. The test apparatus as set forth in claim 2, wherein the aggregating section aggregates the synchronization signals received from the test modules by using a logical AND condition.

9. The test apparatus as set forth in claim 2, wherein the aggregating section aggregates the synchronization signals received from the test modules by using a logical OR condition.

10. The test apparatus as set forth in claim 8, wherein each of the test modules includes a plurality of test sections, the configuration is a configuration of a domain, the domain representing a combination of the test sections, and the aggregating section transmits a synchronization request to the distributing section in response to all of the test sections included in a domain transmitting synchronization requests.

11. The test apparatus as set forth in claim 8, wherein each of the test modules includes a plurality of test sections, the configuration is a configuration of a domain, the domain representing a combination of the test sections, and the aggregating section transmits a synchronization request to the distributing section in response to all digital test sections within the domain transmitting synchronization requests.

12. The test apparatus as set forth in claim 8, wherein each of the test modules includes a plurality of test sections, the configuration is a configuration of a domain, the domain representing a combination of the test sections, and the aggregating section transmits a synchronization request to the distributing section in response to all analog test sections within the domain transmitting synchronization requests.

13. The test apparatus as set forth in claim 9, wherein each of the test modules includes a plurality of test sections, the configuration is a configuration of a domain, the domain representing a combination of the test sections, and the aggregating section transmits a synchronization request to the distributing section in response to one or more of the test sections included in a domain transmitting synchronization requests.

14. A test method for testing a device under test, comprising:

performing a plurality of tests on the device under test using a plurality of test modules; and synchronizing the plurality of tests to each other, the synchronizing comprising:

aggregating synchronization signals received from one or more of the plurality of test modules to generate an aggregated synchronization signal; and distributing a control signal indicating an operation corresponding to the aggregated synchronization signal to a to-be-controlled test module of the plurality of test modules, wherein in the synchronizing, an analog module that performs an analog test on the device under test is synchronized to a digital module that exchanges a digital signal with the device under test based on a control signal corresponding to the aggregated synchronization signal.

15. The test method as set forth in claim 14, wherein the aggregating includes using a logical condition selected according to a configuration from logical conditions including a logical AND condition and a logical OR condition.

16. The test method as set forth in claim 14, wherein the digital module operates in synchronization with a clock of the test apparatus and transmits, as a synchronization signal, a clock signal generated with reference to the clock of the test apparatus,
the clock signal is transmitted to the analog module, and
the analog module operates with reference to an internal clock generated therein, and adjusts a phase of the internal clock based on the clock signal.

17. The test method as set forth in claim 14, wherein the digital module transmits, as a synchronization signal, a trigger signal indicating a timing of an analog test on the device under test,
the trigger signal is transmitted to the analog module, and
the analog module performs an analog test with reference to the trigger signal.

18. The test method as set forth in claim 14, wherein the analog module transmits a trigger signal indicating that a predetermined state is obtained during an analog test on the device under test,
the trigger signal is transmitted to the digital module, and
the digital module performs a test on the device under test with reference to the trigger signal.

19. The test method as set forth in claim 14, wherein the distributing includes:
transmitting the control signal in packets when the to-be-controlled test module is a digital module, and
transmitting the control signal in pulses when the to-be-controlled test module is an analog module.

20. The test method as set forth in claim 14, wherein each of the test modules includes a plurality of test sections,
the test method further comprises storing a plurality of configurations of domains, the domains representing combinations of the test sections, and
the aggregating includes aggregating synchronization requests based on the configurations stored in the configuration storing section.

* * * * *